United States Patent [19]

Yoshihara et al.

[11] Patent Number: 5,045,434
[45] Date of Patent: Sep. 3, 1991

[54] VISIBLE RADIATION SENSITIVE COMPOSITION CONTAINING SUBSTITUTED 3-(BENZOTHIAZO-2-YL)-7-DIETHYLAMINOCOUMARIN AS SENSITIZERS

[75] Inventors: Ichiro Yoshihara; Motoko Okuhara; Takao Yamamoto; Naozumi Iwasawa; Yasuo Doi, all of Kanagawa; Tsukasa Ohyama, Fukuoka; Kazuhiko Murayama, Fukuoka; Yoriaki Matsuzaki, Fukuoka; Susumu Kasamatsu, Fukuoka; Keisuke Takuma, Fukuoka; Kimitoshi Kato, Fukuoka, all of Japan

[73] Assignee: Kansai Paint Co., Ltd., Hyogo, Japan

[21] Appl. No.: 629,484

[22] Filed: Dec. 18, 1990

[30] Foreign Application Priority Data

Dec. 28, 1989 [JP] Japan .................................. 1-338279

[51] Int. Cl.$^5$ ....................... G03C 1/73; G03C 7/025; C08F 2/46; C08J 3/28
[52] U.S. Cl. ..................................... 430/286; 430/281; 430/914; 430/915; 430/926; 430/935; 430/947; 522/14; 522/26
[58] Field of Search ............... 430/286, 281, 915, 914, 430/916, 926; 522/14, 26

[56] References Cited

U.S. PATENT DOCUMENTS

| | | | |
|---|---|---|---|
| 4,147,552 | 4/1979 | Specht et al. | 430/281 |
| 4,250,053 | 2/1981 | Smith | 430/281 |
| 4,289,844 | 9/1981 | Specht et al. | 430/281 |
| 4,743,529 | 5/1988 | Farid et al. | 430/281 |

Primary Examiner—Marion E. McCamish
Assistant Examiner—Mark A. Chapman
Attorney, Agent, or Firm—Burns, Doane, Swecker & Mathis

[57] ABSTRACT

A visible radiation sensitive composition comprising:
(A) a photosetting resin containing a photosensitive group capable of crosslinking or polymerizing by photoirradiation,
(B) a sensitizer represented by the formula (i):

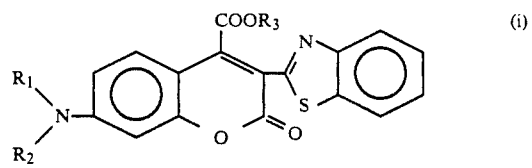

wherein $R_1$ and $R_2$ are the same or different lower alkyl, and $R_3$ is a hydrogen atom, lower alkyl group, alkoxyalkyl group, hydroxyalkoxyalkyl group or alkoxycarbonylalkyl group, and
(C) a polymerization initiator.

16 Claims, 1 Drawing Sheet

VISIBLE RADIATION SENSITIVE COMPOSITION CONTAINING SUBSTITUTED 3-(BENZOTHIAZO-2-YL)-7-DIETHYLAMINOCOUMARIN AS SENSITIZERS

BACKGROUND OF THE INVENTION

1. Field of the Invention

The present invention relates to a visible radiation sensitive composition comprising a novel sensitizer which exhibits high sensitivity to light in the visible region.

2. Description of the Related Art

Conventionally, photosensitive compositions have been widely employed for various uses such as photoresists, engraving materials for litho graphic printing and relief printing, PS plates for offset printing, information recording materials and materials for relief image preparation.

Many of these compositions have sensitivity to ultraviolet light. The sensitivity, however, is generally from several dozens to several hundreds $mj/cm^2$ and has disadvantages that high output is required of a light source and energy conversion efficiency for recording is low. On the other hand, there is a method for forming the image by direct depiction with a light source such as laser which has a high energy density. The method has advantages that the energy conversion efficiency is improved and image forming step is greatly simplified. In the method, visible laser is more favorable than ultraviolet laser as a scanning exposure light source for direct depiction because oscillation beams obtained are stable in view of life and intensity. Consequently, it has been desired to develop a visible radiation sensitive composition which is sensitive to scanning exposure by visible laser, particularly desired visible radiation sensitive composition is a composition which has a high sensitivity to $Ar^+$ laser having stable oscillation beams in the visible region of 488 nm or 514.5 nm in wavelength.

However, photosensitive compositions which can satisfy the above demands have not yet been in practical use.

One of the primary reason is that there are few photosensitive resins which are sensitive to light in the region of long wavelengths.

The second reason is that a suitable photo-polymerization initiator system including a sensitizer has not yet been found.

Several proposals have conventionally been made for a photo-polymerization initiator system which is effective for visible radiation. The systems include, for example, a combination of hexaarylbisimidazol, and p-dialkylaminobenzylidene ketone or diaminoalkylchalcone (U.S. Pat. No. 3,652,275, Japanese Laid-Open Patent SHO 54-155292), a combination of camphorquinone and dye (Japanese Laid Open Patent SHO 48-084183), a combination of diphenyliodonium salt and Michler's ketone (GB. 020,297SA), a combination of S-triazine based compound and merocyanine dyestuff (Japanese Laid-Open Patent SHO 54-151024) and a combination of S-triazine based compound and thiopyrylium salt (Japanese Laid-Open Patent SHO 58-040302). Although the above initiator systems have initiation ability for light beams in the visible region, sensitivity is still unsatisfactory and compatibility with components of photopolymerizable compositions is also insufficient. A more practical photopolymerization initiator system having high sensitivity is desired.

SUMMARY OF THE INVENTION

An object of the present invention is to provide a visible radiation sensitive resin composition having sufficient sensitivity to light in the visible region.

As a result of carrying out an intensive investigation in order to accomplish the object, the present inventors have found that a novel sensitizing compound and a photosensitive composition obtained by using the compound as a sensitizer can solve the above problems, can provide increased sensitivity and can also form an image having a high resolution. Thus the present invention has been completed.

An aspect of the present invention is a visible radiation sensitive composition comprising:

(A) a photosetting resin containing a photosensitive group capable of crosslinking or polymerizing by photoirradiation, (B) a sensitizer represented by the formula (i):

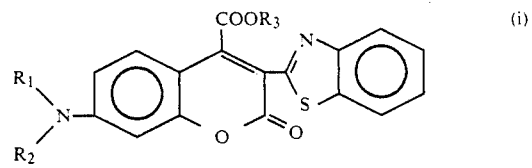

wherein $R_1$ and $R_2$ are the same or different lower alkyl group, and $R_3$ is a hydrogen atom, lower alkyl group, alkoxyalkyl group, hydroxyalkoxyalkyl group or alkoxycarbonylalkyl group, and (C) a polymerization initiator.

The novel sensitizer used for a visible radiation sensitive composition of the invention has a good compatibility with matrlx resins, is soluble in desired solvents and can provide a uniformly and smoothly coated surface on a substrate.

The composition has an extremely high sensitivity to a visible laser such as argon laser which has an oscillation beam at 488 nm or 514.5 nm and hence high speed scanning exposure can be carried out by the laser. Further, formation of image by the high speed scanning exposure is particularly excellent in that an extremely fine image having a high resolution can be obtained.

DESCRIPTION OF THE PREFERRED EMBODIMENTS

Figure 1:
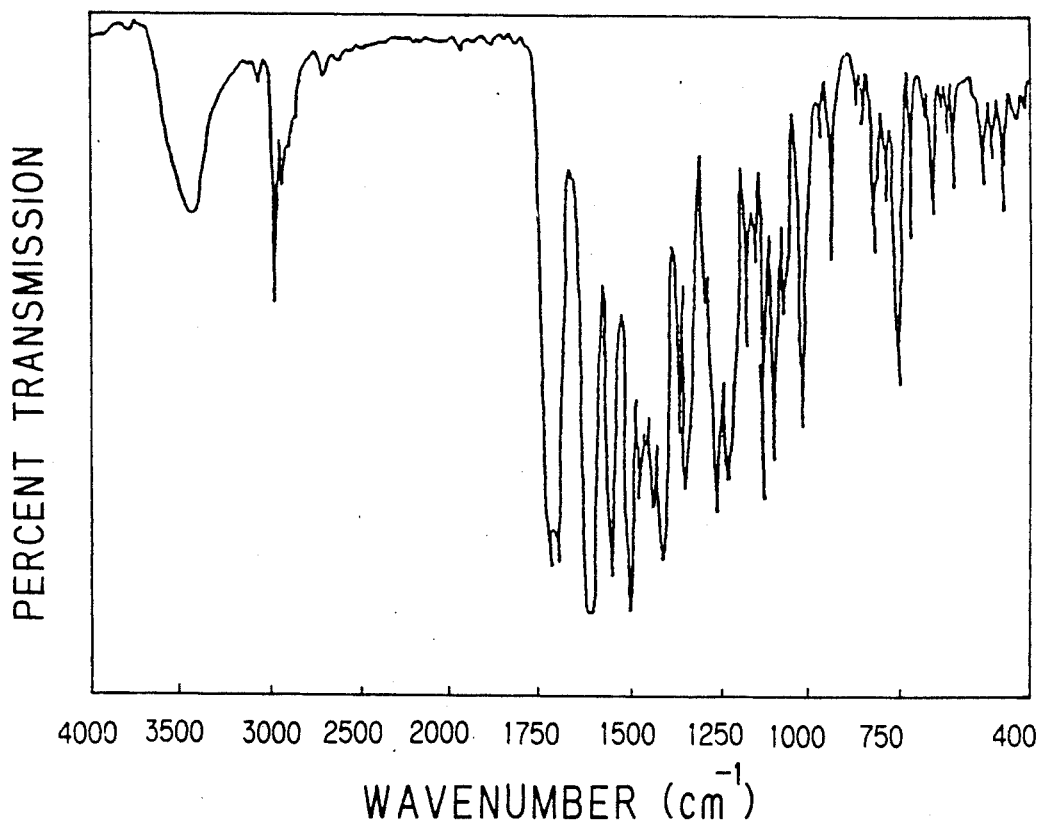
FIG. 1 illustrates an IR absorption spectrum of sensitizer LS-1.

The present invention will hereinafter be described in detail. Photosetting resin (A)

The photosetting resin (A) used in the present invention contains a resin ($a_1$) which contains a photosensitive group capable of undergoing a crosslinking or polymerization reaction by photoirradiation and an ionic group, that is, an anionic or cationic group and is soluble in an aqueous acid or alkali solution, and a resin component ($a_2$) which consists of a combination of an ethylenically unsaturated compound having the above photosensitive group and a binder having the above ionic group. The resin and resin component perform the crosslinking or polymerization reaction by photoirradiation and become substantially insoluble or slightly soluble in the aqueous alkali or acid solution.

The photosensitive group which can exist in the photosetting resin (A) is a group which can initiate the crosslinking or polymerization reaction by photoirradiation in the presence of the sensitizer (B) and the polymerization initiator (C). Exemplary photosensitive group s which have such characteristics includes (meth)acryloyl, i.e., $CH_2=CR-CO-$ wherein R is a hydrogen atom or methyl group, cinnamoyl group, allyl group, azide group and cinnamylidene group.

The above photosetting resin ($a_1$) and ($a_2$) contain the above anionic or cationic group in addition to the photosensitive group. The amount of the ionic group and photo-sensitive group can be varied over a wide range depending upon the kind and molecular weight of the resin or binder used as a matrix. The anionic group, for example, a carbonyl group, is contained in such an amount that the photosetting resin has an acid value in the range of generally from 10 to 300 mgKOH/g, preferably from 30 to 100 mgKOH/g. The cationic group, for example a tertiary amino group or onium base, is contained in the range of generally from 0.2 to 5 moles, preferably from 0.3 to 2.0 moles per kilogram of the resin. The photosensitive group is contained in an amount of generally from 0.2 to 5.0 moles, preferably from 0.7 to 4.5 moles per kilogram of the resin.

The resin ($a_1$) for use in the photosetting resin (A) has a number average molecular weight in the range of generally from 1,000 to 100,000, preferably from 3,000 to 50,000. Preferred resin ($a_1$) has a glass transition temperature (Tg) above 0° C., particularly in the range of from 5° to 70° C. so that the coated film exhibits no tackiness.

The photosetting resin ($a_1$) used for the invention will be illustrated in detail.

(1) Anionic photosetting resin containing a (meth)acryloyl group as a photo sensitive group:

The photo-setting resin can be prepared, for example, by the addition of a glycidyl group containing unsaturated compound to an acrylic based resin having a high acid value. The acrylic based resin of high acid value is obtained by using $\alpha$, $\beta$-ethylenically unsaturated acid such as acrylic acid and methacrylic acid as an essential component and copolymerizing with at least one unsaturated monomer selected from methyl (meth)acrylate, ethyl (meth)acrylate, butyl (meth)acrylate, 2-ethylhexyl (meth)acrylate, hydroxyethyl (meth)acrylate, styrene, (meth)acrylonitrile and (meth)acrylamide. $\alpha$, $\beta$-Ethylenically unsaturated acid can be used in such an amount that the high acid value acrylic base resin has an acid value in the range of generally from 40 to 650 mgKOH/g preferably from 60 to 500 mgKOH/g.

The number average molelcular weight and glass transition temperature (Tg) of the high acid value acrylic based resin is suitably adjusted so that the photosetting resin obtained by the addition of the glycidyl group containing unsaturated compound to said high acid value acrylic base resin has the above mentioned number average molecular weight and Tg.

On the other hand, the glycidyl group containing unsaturated compound to be added to the above high acid value acrylic based resin includes, for example, glycidyl acrylate and glycidyl methacrylate.

The addition reaction of the above high acid value acrylic based resin and glycidyl group containing unsaturated compound can be readily carried out according to a known method, for example, by reacting at 80° to 120 C. for 1 to 5 hours in the presence of a catalyst such as tetraethyl ammonium bromide.

The photosetting resin can also be prepared by adding the reaction product of a hydroxyl group containing polymerizable unsaturated compound with a diisocyanate compound to a hydroxyl group containing acrylic resin.

Exemplary hydroxyl group containing polymerizable unsaturated compounds for use include 2-hydroxyethyl acrylate, 2-hydroxyethyl methacrylate, 2-hydroxypropyl acrylate and N-methylol acrylamide. The diisocyanate compound includes, for example, tolylene diisocyanate, xylylene diisocyanate, hexamethylene diisocyanate and lysine diisocyanate.

(2) Photosetting resin containing a cinnamoyl group as a photo sensitive group

The photosetting resin can be prepared by reacting a hydroxyl group containing acrylic based resin with a substituted or unsubstituted cinnamoyl halide in the presence of a base, for example, in a pyridine solution. The hydroxyl group containing acrylic based resin used in the reaction can be obtained by using as essential components the $\alpha$, $\beta$-ethylenically unsaturated acid and the hydroxyl group containing polymerizable unsaturated compound which are described in the above item(1) and by copolymerizing those components with at least one other unsaturated monomer.

The amount of the substituted or unsubstituted cinnamoyl halide which can be used is in the range of generally from 6 to 180 parts by weight, preferably from 30 to 140 parts by weight per 100 parts by weight of the above hydroxyl group containing acrylic based resin.

The substituted or unsubstituted cinnamoyl halide which can be used includes the cinnamoyl halide which may have on the benzene ring from 1 to 3 substituents selected from nitro group and lower alkoxy group. Exemplary cinnamoyl halides include cinnamoyl chloride, p-nitrocyannamoyl chloride, p-methoxycinnamoyl chloride and p ethoxycinnamoyl chloride.

(3) Photosetting resin containing allyl group as a photosensitive group:

The photosetting resin can be prepared, for example, by the addition of allyl glycidyl ether:

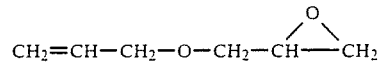

to the high acid value acrylic based resin used in the above item(1) or by the addition of the reaction product of (meth)allyl alcohol with a diisocyanate based compound to the hydroxy group containing acrylic resin.

The above addition reaction of the high acid value acrylic based resin and allyl glycidyl ether can be carried out by the same procedures as described in the above item(1).

In the visible radiation sensitive composition of the invention, conventionally known cationic resins can also be used as the photosetting resin ($a_1$) in place of the anionic resin.

Exemplary cationic resins include:

① a resin obtained by adding the reaction product of a hydroxyl group containing polymerizable unsaturated compound with a diisocyanate compound to an acrylic resin having a hydroxyl group and a tertiary amino group, ② a tertiary amino group containing resin obtained by reacting an epoxy resin with a secondary amine and thereafter reacting residual epoxy group with a polymerizable unsaturated monocarboxylic acid or a hydroxyl group containing unsaturated compound, ③ a tertiary amino group containing resin obtained by reacting a polymerizable unsaturated monocarboxylic acid or a hydroxyl group containing polymerizable unsaturated compound with a resin obtained by copolymerizing a glycidyl group containing unsaturated compound and a tertiary amine containing unsaturated compound with other polymerizable unsaturated monomer, and ④ an onium base containing resin obtained by reacting an epoxy resin with a polymerizable unsaturated monocarboxylic acid or a hydroxyl group containing unsaturated compound and thereafter converting the residual epoxy group to the onium base in the presence of a carboxylic acid and a tertiary amino compound, thio ether or phosphine.

The resin can be used singly or as a mixture.

The ethylenically unsaturated compound and the ionic group containing binder in the photosetting resin component ($a_2$) used in the invention will hereinafter be described in detail.

Ethylenically unsaturated compound

Ethylenically unsaturated compound has at least one ethylenically unsaturated bond in the chemical structure and includes monomer, dimer, trimer and other oligomers which are capable of addition polymerizing by exposure to visible radiation to cause insolubilization of the exposed portions.

Exemplary ethylenically unsaturated compounds include unsaturated carboxylic acids and esters composed of unsaturated carboxylic acid and at least divalent aliphatic or aromatic polyhydroxy compound.

Unsaturated carboxylic acids include, for example, acrylic acid, methacrylic acid, crotonic acid, α-methylcrotonic acid and itaconic acid.

Representative aliphatic polyhydroxy compounds include divalent alcohols such as ethylene glycol, diethylene glycol, triethylene glycol, neopentyl glycol, propylene glycol, 1,2-butanediol and 1,6-hexanediol; trivalent alcohols such as trimethylolethane, trimethylolpropane and glycerol; and alcohols of tetravalence or more such as pentaerythritol and dipentaerythritol.

Aromatic polyhydroxy compound includes, for example, hydroquinone, catechol, resorcinol and pyrogallol.

Exemplary esters prepared from aliphatic polyhydroxy compound and unsaturated carboxylic acid include acrylic acid esters such as ethylene glycol diacrylate, diethylene glycol diacrylate, triethylene glycol diacrylate, tetraethylene glycol diacrylate, propylene glycol diacrylate, trimethylolpropane triacrylate, trimethylolethane triacrylate, pentaerythritol diacrylate, pentaerythritol triacrylate and pentaerythritol tetraacrylate; methacrylic acid esters such as ethylene glycol dimethacrylate, diethylene glycol dimethacrylate triethylene glycol dimethacrylate, trimethylolpropane trimethacrylate, trimethylolethane trimethacrylate, pentaerythritol dimethacrylate, pentaerythritol trimethacrylate, pentaerythritol tetramethacrylate and tetramethylene glycol dimethacrylate; crotonic acid esters such as ethylene glycol dicrotonate and pentaerythritol dicrotonate; itaconic acid esters such as ethylene glycol diitaconate and propylene glycol diitaconate and maleic acid esters such as ethylene glycol dimaleate, pentaerythritol dimaleate and trimethylolpropane dimaleate.

Exemplary esters prepared from aromatic polyhydroxy compound and unsaturated carboxylic acid include hydroquinone diacrylate, hydroquinone dimethacrylate, hydroquinone dicrotonate, resorcinol diacrylate and pyrogallol triacrylate.

The above ethylenically unsaturated compound is used in combination with the below described binder which is compatible with the unsaturated compound.

Ionic group containing binder

The binder has an anionic or cationic group and leads to satisfactory performance such as good compatibility with the ethylenically unsaturated compound, good adhesion to a substrate formation of a strong film having wear resistance, and image development with ease.

Exemplary binders include an acrylic based multicomponent copolymer containing the ethylenically unsaturated acid, for example, acrylic acid, methacrylic acid, maleic acid, crotonic acid and itaconic acid as an essential component in a suitable combination with alkyl (meth)acrylate such as methyl, ethyl, 2-ethylhexyl or dodecyl (meth)acrylate, other (meth)acrylic ester, or other unsaturated monomer such as styrene, acrylonitrile, vinyl chloride, vinylidene chloride and butadiene; a copolymer of maleic anhydride and at least one monomer selected from styrene, vinyl alkyl ether, isobutylene, vinyl chloride and maleic acid diester, and a modified polymer obtained by partial esterification of the copolymer; modified acid cellulose having a carboxyl copolymer in the side chain; and an acrylic based multicomponent copolymer having the tertiary amino group containing ethylenically unsaturated monomer, for example, N,N-dimethylaminoethyl (meth)acrylate, N,N-diethylaminoethyl (meth) acrylate and N,N dimethylaminopropyl (meth)acrylate, as an essential component in a suitable combination with the above (meth) acrylic acid alkyl ester and other unsaturated monomers.

The blending proportion of the above ethylenically unsaturated compound to the binder is in the range of from 80/20 to 20/80 by weight and is adjusted so as to obtain the amount of the photosensitive group and the ionic group in the above mentioned range.

The resins ($a_1$) and ($a_2$) are intended to be capable of alkali development or acid development. However, solvent development does not always require ionic groups such as ($a_1$) and ($a_2$). Consequently, a resin which has an acid value of less than 10 mg KOH/g, a cationic group of less than 0.2 mole per kilogram of the resin, and contains essentially no ionic groups is also included in the scope of the photosetting resin (A) of the present invention.

Such type of resin performs a crosslinking or polymerization reaction by photoirradiation and becomes substantially insoluble or slightly soluble in solvents. Hence, a photosetting resin ($a_3$) which contains a photosensitive group and no ionic groups, has an acid value of less than 10 mgKOH/g, and contains a cationic group of less than 0.2 mole per kilogram of the resin, and a resin component ($a_4$) consisting of a combination of the above photosensitive group containing ethylenically unsaturated compound and a binder without containing an ionic group are also included in such type of resin.

The photosensitive group of the photosetting resin ($a_3$) can be the same kind as that of ($a_1$) and the amount of the photosensitive group is in the same range as that of ($a_1$).

In the resin component ($a_4$) consisting of a combination of the ethylenically unsaturated compound and the binder without an ionic group, the ethylenically unsaturated compound has, as mentioned above, at least one ethylenically unsaturated bond in the molecule.

The binder without an ionic group is required to have such properties as good compatibility with other components contained in the composition, good adhesion to the substrate, formation of a strong film having wear resistance, and ready development of image in the solvent.

Exemplary binders include a multicomponent copolymer prepared by using (meth)acrylic acid alkyl ester such as methyl, ethyl, n propyl, iso-propyl, n-butyl, isobutyl, t-butyl, n-hexyl, 2-ethylhexyl and dodecyl ester in combination with at least one monomer selected from other (meth)acrylic acid esters such as benzyl (meth)acrylate and tetrahydrofurfuryl (meth)acrylate, acrylonitrile, vinyl chloride, vinylidene chloride, styrene and butadiene; poly-α-methylstyrene, polyurethane, polyamide, polyvinylbutyral, polyvinylformal, polyvinyl acetate, polyvinylpyrrolidone, chlorinated polyethylene, chlorinated polypropylene, vinyl chloride/vinyl acetate copolymer, methylcellulose, ethylcellulose and acetylcellulose. The binder can be used singly or can also be used as a mixture in a suitable ratio which maintains good compatibility with each other.

The molecular weight (MW) of polymer used for the binder is preferably in the range of from 3,000 to 500,000, more preferably from 5,000 to 300,000.

The blending proportion of the binder to the ethylenically unsaturated compound is in the range of from 80/20 to 20/80, preferably from 70/30 to 30/70.

Sensitizer (B)

Sensitizer (B) used in the present invention is a compound represented by the formula (i):

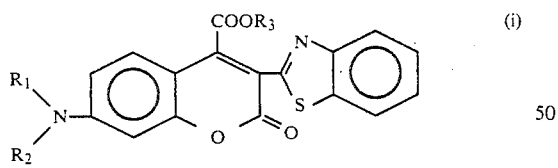

(i)

wherein $R_1$ and $R_2$ are same or different lower alkyl groups, and $R_3$ is a hydrogen atom, lower alkyl group, alkoxyalkyl group, hydroxyalkyl group or alkoxycarbonylalkyl group. The compound is excited by absorbing light (visible radiation) having a wave length region of from 400 to 700 nm and interacts on the photosetting resin (A) and a polymerization initiator (C) described below. The term "interaction" referred to includes energy transfer or electron transfer from the excited sensitizer (B) to the photosetting resin (A) or the polymerization initiator (C).

In the above formula (i), $R_1$ and $R_2$ are lower alkyl groups such as methyl, ethyl, propyl, isopropyl and butyl, and $R_3$ is a hydrogen atom, lower alkyl group such as methyl, ethyl, propyl, isopropyl and butyl; alkoxyalkyl group such as methoxymethyl, methoxyethyl, ethoxyethyl, propoxyethyl, methoxypropyl, ethoxypropyl and propoxypropyl; hydroxyalkoxyalkyl group such as hydroxymethoxyethyl, hydroxyethoxyethyl, hydroxypropoxyethyl, hydroxymethoxypropyl, hydroxyethoxypropyl and hydroxypropoxypropyl; and alkoxycarbonyl alkyl group such as methoxycarbonylmethyl, ethoxycarbonylmethyl, ethoxycarbonylethyl, propoxycarbonylpropyl and butoxycarbonylbutyl.

Exemplary sensitizers (B) include compounds illustrated by the following formulas:

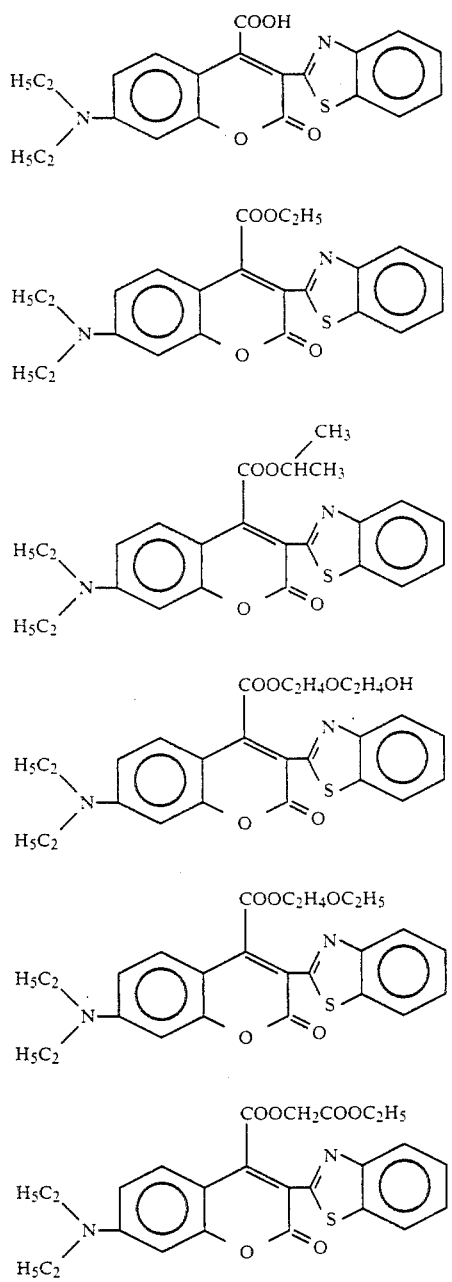

The above sensitizer (B) can be prepared, for example, by the following reaction process.

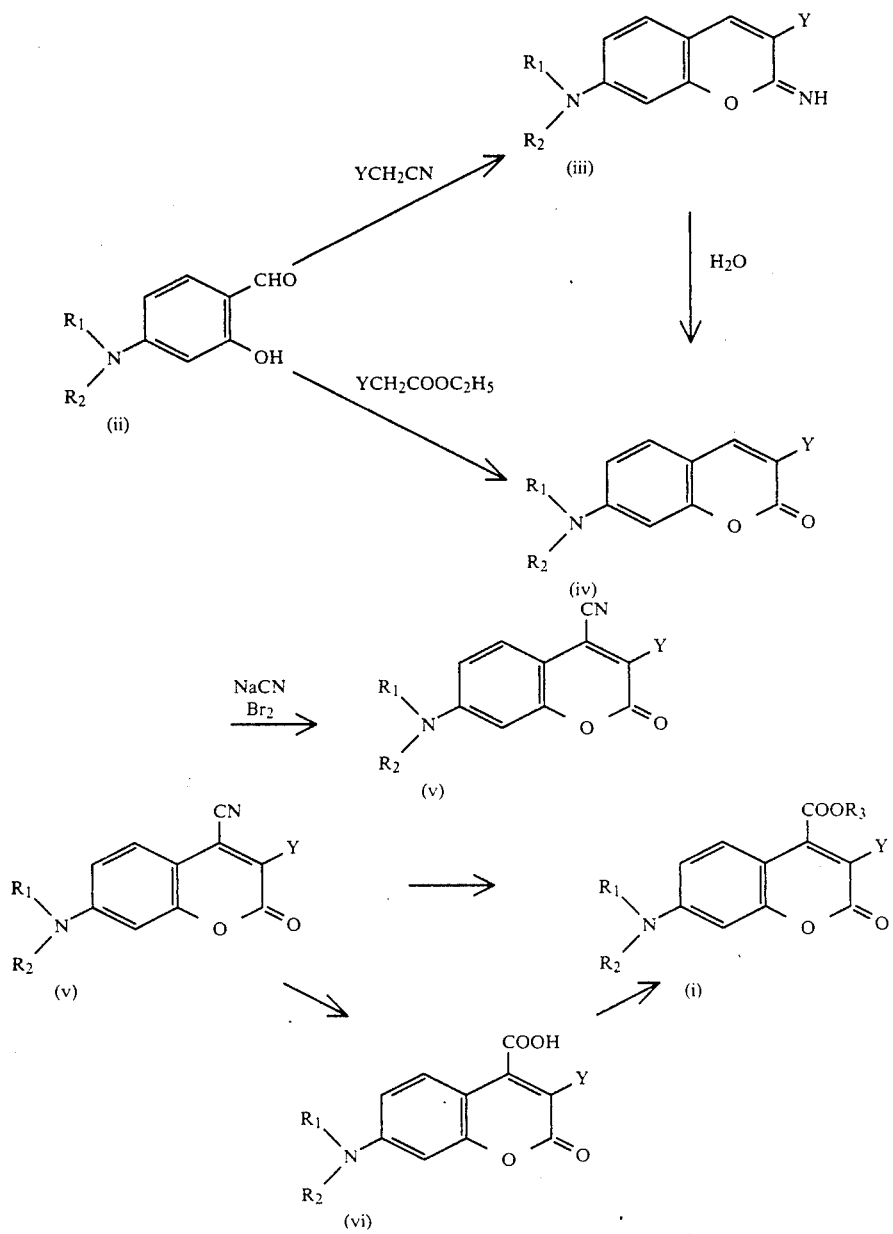

In the above reaction formula, $R_1$, $R_2$ and $R_3$ are the same as above and Y is

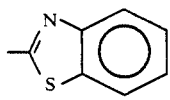

In the above process, raw material 4-(substituted amino) salicylaldehyde (ii) is mixed with a cyanomethyl substituted compound in a ratio of 1:1 in a polar solvent such as methanol, ethanol, N,N-dimethylformamide (hereinafter referred to as DMF) and dimethyl sulfoxide. About one tenth, i.e., a catalytic amount of a weak base is added to the mixture. Preferred weak bases include, for example, amines such as piperidine, pyrrolidine, pyridine and aniline.

The mixture is reacted at 0° to 80° C. for 1 to 12 hours to obtain compound (iii). Compound (iii) is boiled for 2 to 6 hours in a 5 to 20 times the amount of a dilute aqueous hydrochloric acid having a concentration of 1 to 5% by weight to obtain compound (iv). Alternatively, the compound (iv) can be directly obtained without passing through the compound (iii) by using an alkoxycarbonylmethyl substituted compound in place of the cyanomethyl substituted compound and reacting by the same procedures as above.

Convension of the compound (iv) to a cyano derivative (v) is carried out according to the method described in Dyes and Pigments, vol. 1, page 3 ~ 15 (1980). The compound (iv) is reacted with NaCN in DMF and then oxidized with bromine to obtain the cyano derivative(v).

The cyano derivative (v) can be converted to the novel compound (i) by the following various methods. The cyano group is hydrolyzed by heating at 70° to 100° C. in 50 to 80% by weight of sulfuric acid to give a carboxylic acid derivative (vi). The carboxylic acid derivative (vi) is reacted with alcohols, amines, halogenated alkyls, various acrylates or phenols. The reaction is carried out after converting to an acid chloride by reaction with a chlorinating agent or conducted by heating in the presence or absence of an acid catalyst and dehydrating agent. In another method, the compound (i) can be directly obtained by dropwise adding concentrated sulfuric acid to an alcohol solution containing about equimolar amounts of the cyano derivative (v) and water, and thereafter heating to 50° to 100° C. A carbon atom can also be introduced directly into the carbonyl group by reacting the cyano group with a Grignard's reagent such as BrMgX.

The amount of the sensitizer (B) used differs depending upon the kind of sensitizer itself and also upon the kind of the photosetting resin (A) and/or the polymerization initiator (C) which are to be interacted. The amount is generally in the range of from 0.1 to 10 parts by weight, preferably from 0.3 to 5 parts by weight per 100 parts by weight of the component (A), though difficult to define strictly. When the amount of the sensitizer (B) is less than 0.1 part by weight, the photosensitivity of the formed film is unfavorably reduced. On the other hand, an amount exceeding 10 parts by weight tends to make uniform retention of the sensitizer in the composition difficult in view of solubility.

Polymerization initiator (C)

The visible radiation sensitive composition of the present invention includes a polymerization initiator. The initiator decomposes due to the action of the sensitizer by photoirradiation and initiates a crosslinking reaction or polymerization reaction of the above photosensitive group.

The polymerization initiator is a compound which decomposes by the interaction with the above sensitizer (B), and more particularly, is a compound which generates an active radical on the crosslinking reaction or the polymerization reaction of the above photosensitive group by its own cleavage reaction or by a hydrogen abstraction reaction from other molecules.

Exemplary polymerization initiators of the invention include aromatic carbonyl compounds such as benzophenone, benzoin methyl ether, benzoin isopropyl ether, benzyl, xanthone, thioxanthone and anthraquinone; acetophenones such as acetophenone, propiophenone, α-hydroxyisobutylphenone, α,α'-dichloro-4-phenoxyacetophenone and 1-hydroxy-1-cyclohexylacetophenone; organic peroxides such as benzoyl peroxide, tert butylperoxy benzoate, tert-butylperoxy 2-ethylhexanoate, tert-butyl hydroperoxide, di-tert-butyldiperoxy isophthalate and 3,3',4,4'-tetra (tert-butylperoxycarbonyl)benzophenone; diphenylhalonium salts such as diphenyliodonium chloride; organic halogen compounds such as carbon tetrachloride, carbon tetrabromide, chloroform and iodoform; heterocyclic and polycyclic compounds such as 3-phenyl-5 isooxazolone and 2,4,6-tris(trichloromethyl-1,3,5-triazinebenzanthrone; azo compounds such as 2,2'-azo(2,4-dimethylvaleronitrile), 2,2'-azobisisobutyronitrile, 1,1'-azobis(cyclohexane-1-carbonitrile) and 2,2'-azobis(2 methylbutyronitrile); iron-arene complexes (see European Patent 152,377): titanocene compounds (see Japanese Laid-Open Patent SHO 63-221110); bisimidazole based compounds; N-arylglycine based compounds; acridine based compounds and a combination of aromatic ketone and aromatic amine.

In the above polymerization initiator, di-tert-butyldiperoxy isophthalate, 3,3', 4,4'-tetra (tert butylperoxycarbonyl)-benzophenone, iron-arene complex and titanocene compound are preferred because of high activity to crosslinking and polymerization.

Preferred examples of the above iron-arene complexes include those illustrated by the three formulas (I), (II) and (III):

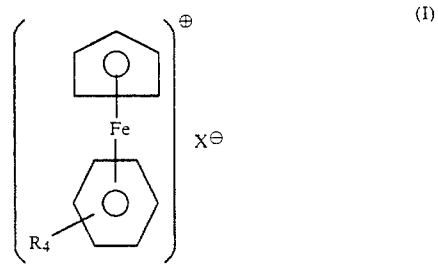

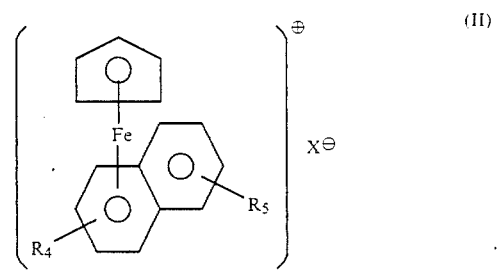

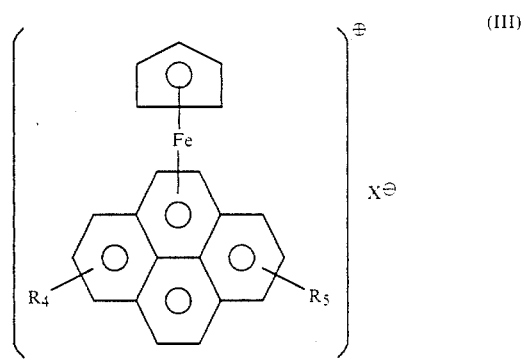

wherein X is $BF_4$, $PF_6$, $AsF_6$ or $SbF_6$, and $R_4$ and $R_5$ are straight or branched alkyl group having from 1 to 6 carbon atoms, for example, $-CH_3$, $-C_2H_5$, $-CH(CH_3)_2$ and $-CH_2CH_2CH_2CH_3$.

Preferred examples of the above titanocene compound include those represented by the formula (IV):

wherein two $R_6$ are individually cyclopentadienyl which are unsubstituted or substituted with one or two methyl, preferably cyclopentadienyl or methylcyclopentadienyl, $R_7$ and $R_8$ are individually represented by the following formula:

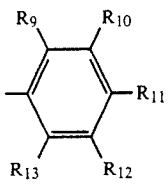

wherein $R_9$ is a fluorine atom, $-CF_3$, or $-CF_2CH_3$, and $R_{10}$, $R_{11}$, $R_{12}$, and $R_{13}$ are individually a fluorine atom, $-CF_3$, $-CF_2CH_3$, hydrogen atom, alkyl group having from 1 to 18 carbon atoms, alkoxy or

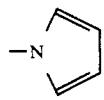

The above titanocene compounds which are suitable for use in the invention include, for example, those illustrated by the following formulas:

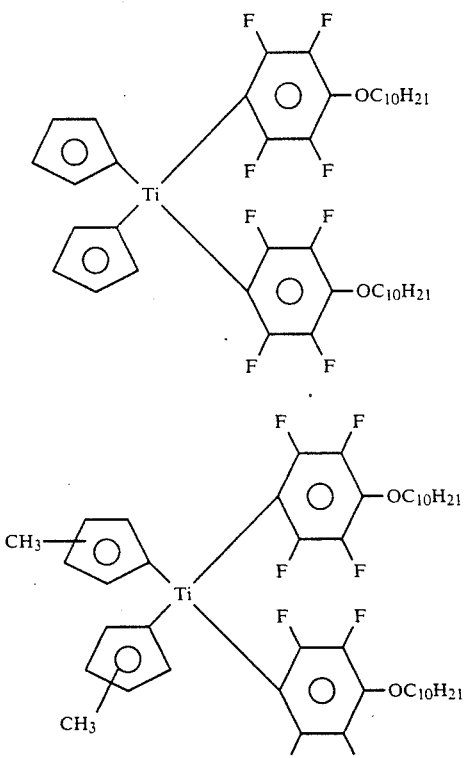

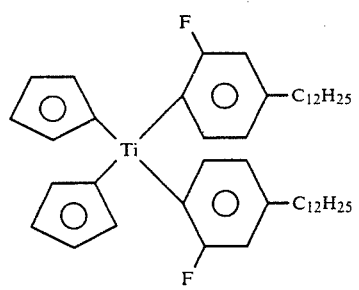

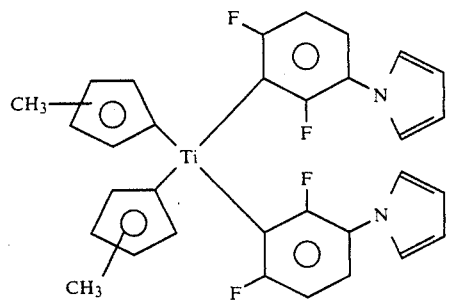

The amount of the polymerization initiator is not critical and can be varied in a broad range depending upon its kind and is in the range of generally from 0.1 to 25 parts by weight, preferably from 0.2 to 10 parts by weight per 100 parts by weight of the solid matter in the photosetting resin (A). An amount exceeding 25 parts by weight decreases the stability of the composition obtained.

The visible radiation sensitive composition of the invention can be mixed, if necessary, with a nitrogen containing compound illustrated by the formula (1) to (6):

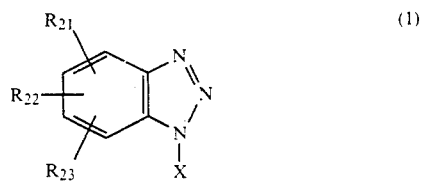
(1)

wherein X is a hydrogen atom or hydroxyl, $R_{21}$, $R_{22}$ and $R_{23}$ are respectively a hydrogen atom, chlorine atom, or alkyl group having from 1 to 6 carbon atoms.

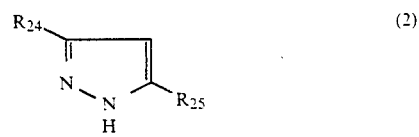
(2)

wherein $R_{24}$ and $R_{25}$ are individually a hydrogen atom or alkyl group having from 1 to 6 carbon atoms,

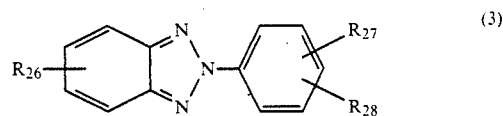
(3)

wherein $R_{26}$, $R_{27}$ and $R_{28}$ are individually a hydrogen atom, hydroxyl group, or alkyl group having from 1 to 12 carbon atomes,

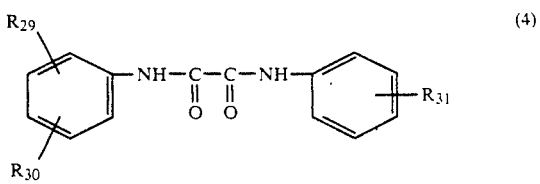
(4)

wherein $R_{29}$, $R_{30}$ and $R_{31}$ are individually a hydrogen atom, hydroxyl group, alkyl group having from 1 to 12 carbon atoms or alkoxy group having from 1 to 12 carbon atoms,

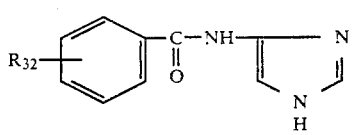

wherein $R_{32}$ is a hydrogen atom, hydroxyl group, alkyl group having from 1 to 12 carbon atoms or alkoxy group having from 1 to 12 carbon atoms, and

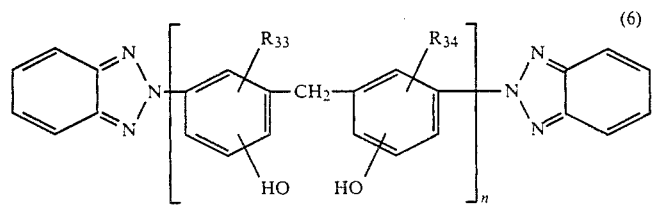

wherein $R_{33}$ and $R_{34}$ are individually a hydrogen atom or alkyl group having from 1 to 12 carbon atoms, and n is an integer of from 1 to 3.

The compound of the formula (1) includes benzotriazoles, for example, illustrated by the following formulas:

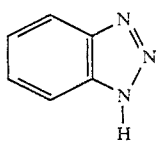

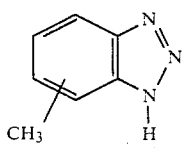

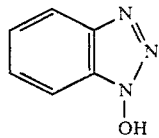

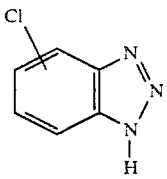

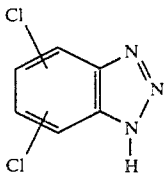

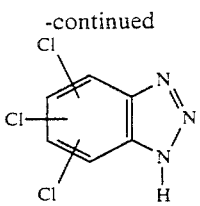

The compounds of the formula (2) includes pyrazoles, for example, illustrated by the following formulas:

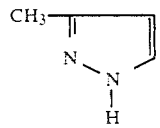

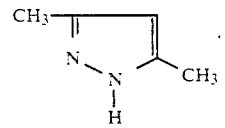

The compound of the formula (3) includes, for example:

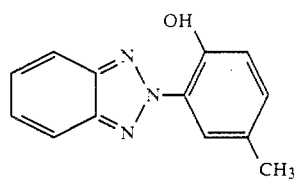

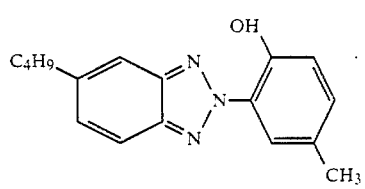

The compound of the formula (4) includes, for example:

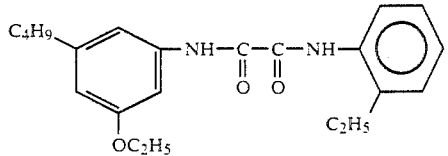

-continued

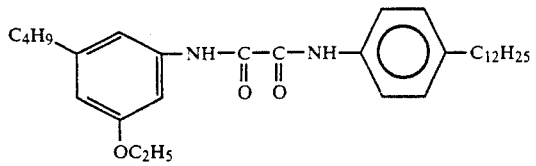

The compound of the formula (5) includes, for example:

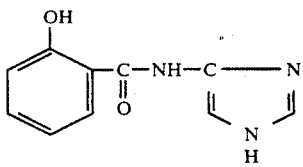

The compound of the formula (6) includes, for example:

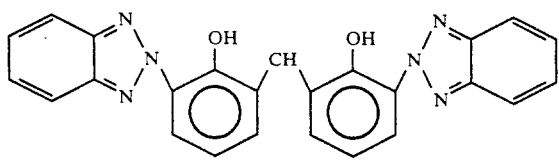

The above nitrogen containing compound which is particularly suitable for the present invention is benzotriazoles illustrated by the formula (1).

The nitrogen containing compound can be used singly or in combination in the composition of the invention. The amount used is in the range of generally 20 parts by weight or less, preferably from 0.1 to 10 parts by weight per 100 parts by weight of the solid matter in the photosetting resin (A).

When the above nitrogen containing compound is mixed into the composition of the invention, sensitizing action is further enhanced and extremely high sensitivity can be obtained. Similarly resolution of image can also be increased by using the nitrogen containing compound.

When the composition of the invention is applied to electrodeposition coating, the nitrogen containing compound has a strong ability to form chelates with ions of metal such as copper and inhibits reaction between metal ions eluted in the electrodeposition coating and ionic groups such as carboxyl group in the photosetting resin (A). Hence, the nitrogen containing compound inhibits high molecular weight formation and crosslinking of the precipitated resin. As a result, the difference in solubility in an unexposed portion is assumed to become greater and leads to increased resolution.

The visible radiation sensitive composition of the invention can be processed by generally known methods. For example, the composition is dissolved in a solvent. When a pigment is used as a colorant, a fine particle dispersion is prepared from the composition. The solution or dispersion obtained is applied to a substrate by use of coating devices such as a roller, roll coater and spin coater and dried. The coated substrate can be used as a visible radiation sensitive material.

The solvents suitable for use in the invention include, for example, ketones such as acetone, methyl ethyl ketone and methyl isobutyl ketone; esters such as ethyl acetate, butyl acetate, methyl benzoate and methyl propionate; ethers such as tetrahydrofuran, dioxane and dimethoxyethane; glycol ethers such as methoxyethanol, ethoxyethanol and diethylene glycol monomethyl ether; aromatic hydrocarbons such as benzene, toluene, xylene and ethylbenzene; halogenated hydrocarbons such as chloroform, trichloroethylene and dichloromethane; alcohols such as ethyl alcohol and benzyl alcohol; and other miscellaneous solvents such as dimethylformamide and dimethyl sulfone oxime.

The substrate used includes, for example, a sheet of metal such as aluminum, magnesium, copper, zinc, chromium, nickel and iron; a sheet of an alloy composed of these metals; a printed substrate surface-treated with these metals; wafers of plastics, glass or silicon; and carbon.

The visible radiation sensitive composition of the present invention can also be used for electrodeposition coating by making the photosetting resin (A) water soluble or water dispersible.

The water soluble or water dispersible photosetting resin (A) can be prepared by neutralizing with alkali when an anionic group such as carboxyl is introduced into the resin (A), or by neutralizing with acid when a cationic group such as amino is introduced into the resin (A). Exemplary alkali used for the neutralization includes alkanolamines such as monoethanolamine, diethanolamine and triethanolamine; alkylamines such as triethylamine, diethylamine, monoethylamine, diisopropylamine, trimethylamine and diisobutylamine; alkylalkanolamines such as dimethylaminoethanol; alicyclic amines such as cyclohexylamine; alkali metal hydroxides such as sodium hydroxide and potassium hydroxide; and ammonia. Exemplary acids used for the neutralization include formic acid, acetic acid, lactic acid and other monocarboxylic acids. These neutralizing agents can be used singly or as a mixture.

The amount of the neutralizing agents is in the range of from 0.2 to 1 equivalent, preferably from 0.3 to 0.8 equivalent per mole of the ionic group contained in the photosetting resin (A).

In order to further increase the flowability of the water soluble or dispersible resin component, a hydrophilic solvent can be added, if desired, to the photosetting resin (A) above. Exemplary hydrophilic solvents include methanol, ethanol, isopropanol, n-butanol, t-butanol, methoxyethanol, ethoxyethanol, butoxyethanol, ethylene glycol monomethyl ether, dioxane and tetrahydrofuran. The amount of the hydrophilic solvent used is generally 300 parts by weight or less, preferably 100 parts by weight or less per 100 parts by weight of the solid component in the photosetting resin (A).

In order to increase the amount coated on the substrate, a hydrophobic solvent can also be added to the above photosetting resin (A). Exemplary hydrophobic solvents include petroleum based solvents such as toluene and xylene; ketones such as methyl ethyl ketone and methyl isobutyl ketone; esters such as ethyl acetate and butyl acetate; and alcohols such as 2-ethylhexyl alcohol and benzyl alcohol. The amount of the hydrophobic solvent used is usually 200 parts by weight or less, preferably 100 parts by weight or less per 100 parts by weight of the solid matter in the photo setting resin (A).

The composition used for electrodeposition can be prepared by conventionally known processes. For example, the water soluble resin (A) obtained by the above neutralization, sensitizer (B), polymerization initiator (C) and, if necessary, the nitrogen containing compound, solvent and other components are mixed well and water is added to the mixture obtained.

The composition thus prepared is diluted with water by conventional procedures to obtain an electrodeposition coating compound or a coating bath having, for example, a pH in the range of from 4 to 9, and a bath concentration (solid concentration) in the range of from 3 to 25% by weight, preferably from 5 to 15% by weight.

The electrodeposition coating compound thus prepared can be applied to the substrate conductor surface by the following manner. The conductor is a conductive material such as metals, carbon and tin oxide or a material obtained by laminating or plating the conductive material on a surface of plastics or glass.

Bath temperature is maintained in the range of from 15° to 40° C. preferably from 15° to 30° C., and pH and bath concentration are controlled in the above ranges. The conductor to be coated is submerged into the electrodeposition bath thus controlled. When the electrodeposition coating compound is an anionic type, the conductor is used as an anode. When the coating compound is a cationic type, the conductor is used as a cathode. Electrodeposition is conducted by direct current at 5 to 200 v for 30 seconds to 5 minutes to obtain a deposited film having a dry thickness of generally from 0.5 to 50 μm, preferably from 1 to 15 μm.

After finishing electrodeposition, the coated substrate is released from the bath, washed with water and dried with hot air to remove moisture contained in the electrodeposited film.

The visible radiation sensitive material thus formed on the conductor surface and the visible radiation sensitive electrodeposited film obtained by electrodeposition can be cured by exposure to visible radiation through a stencil to create an image. The image can be thereafter formed by removing the unexposed portions of the film through development treatment.

The source of light which can be used for the exposure can be obtained from a extra high pressure, high pressure, medium pressure or low pressure mercury lamp, chemical lamp, carbon arc lamp, xenone lamp, metal halide lamp, fluorescent lamp, tungsten lamp and solar light. The light obtained from the above various sources are passed through a ultraviolet cutting filter to remove ultraviolet rays. The resulting light in the visible region and various lasers having oscillation beams in the visible region can be used as light sources for the exposure.

The development treatment is carried out by using an aqueous alkali solution for the anionic film in the unexposed portion and an aqueous acid solution of pH 5 or less for the cationic film in the unexposed portion. The aqueous alkali solution is an aqueous solution of usually sodium hydroxide, sodium carbonate, potassium hydroxide and ammonia which can neutralize free carboxylic acid in the film to provide solubility in water. The aqueous acid solution which can be used is acetic acid, formic acid and lactic acid.

The development treatment of the composition comprising the photosetting resin ($a_3$) and ($a_4$) which have no ionic groups is carried out by using a solvent such as 1,1,1-trichloroethane, trichloroethylene, methyl ethyl ketone and methylene chloride to dissolve the unexposed portions.

After finishing development treatment, the coated film is washed with water and dried with hot air to form the desired image on the conductor. Exposed conductor surface can be removed by etching, if necessary, and the printed circuit board can be prepared by successively removing a resist film.

The composition of the invention can be widely applied to uses such as materials for litho graphic printing and relief printing, PS plates for offset printing, information recording materials and materials for relief image preparations.

The present invention will hereinafter be illustrated further in detail by way of examples. In these examples, part means part by weight.

SYNTHESIS EXAMPLE 1 OF PHOTOSETTING RESIN

A mixture composed of 40 parts of methyl methacrylate, 40 parts of butyl acrylate, 20 parts of acrylic acid and 2 parts of azobisisobutyronitrile was dropwise added in a nitrogen atmosphere over 3 hours into 90 parts of propylene glycol monomethyl ether (hydrophilic solvent) which is maintained at 110° C.

After finishing addition, the reaction mixture was aged for an hour, and then a mixture composed of 1 part of azobisdimethylvaleronitrile and 10 parts of propylene glycol monomethyl ether was dropwise added over an hour and aged for 5 hours to obtain a solution of high acid value acrylic resin having an acid value of 155 mgKOH/g.

To the acrylic resin solution thus obtained, 24 parts of glycidyl methacrylate, 0.12 part of hydroquinone and 0.6 part of tetraethylammonium bromide were added and reacted at 110° C. for 5 hours with air blowing to obtain a solution of the photosetting resin having an acid value of about 50 mgKOH/g, degree of unsaturation of 1.35 mole/kg, Tg of 20° C. and number average molecular weight of about 20,000.

SYNTHESIS EXAMPLE 2 OF PHOTOSETTING RESIN

A mixture composed of 60 parts of styrene, 10 parts of methyl acrylate, 30 parts of acrylic acid and 3 parts of azobisisobutyronitrile was dropwise added in a nitrogen atmosphere over 3 hours into 90 parts of ethoxyethanol maintained at 120° C. After finishing the addition, the reaction mixture was aged for an hour, and then a mixture composed of 1 part of azobisd imethylvaleronitrile and 10 parts of ethoxyethanol was dropwise added over an hour and aged for further 5 hours to obtain a solution of high acid value acrylic resin having an acid value of 233 mgKOH/g.

To the acrylic resin solution thus obtained, 35 parts of glycidyl methacrylate, 0.13 part of hydroquinone and 0.6 part of tetraethylammonium bromide were added and reacted at 110° C. for 5 hours with air blowing to obtain a solution of photosetting resin having an acid value of about 70 mgKOH/g, degree of unsaturation of 1.83 mole/kg, Tg of 45° C. and number average molecular weight of about 15,000.

SYNTHESIS EXAMPLE 3 OF PHOTOSETTING RESIN

A mixture composed of 25 parts of methyl methacrylate, 15 parts of n-butyl acrylate, 15 parts of acrylic acid, 45 parts of 2-hydroxyethyl methacrylate and 2 parts of azobisisobutyronitrile was dropwise added in a nitrogen atmosphere over 3 hours into 100 parts of dimethylformamide (DMF) maintained at 80° C. After finishing the addition, the reaction mixture was aged for an hour, and than a mixture composed of 1 part of azobisdimethylvaleronitrile and 5 parts of DMF was dropwise added over an hour and aged for further 5 hours to obtain a solution of acrylic resin having an acid value of 115 mgKOH/g.

To 200 parts of the polymer solution thus obtained, 120 parts of pyridine was added and a solution of 57 parts of cinnamoyl chloride in 150 parts of DMF was further added dropwise at 10° C. or less. The resulting mixture was stirred at 50° C. for 4 hours and the reaction mixture thus obtained was poured into 500 parts of methanol to precipitate the polymer. The polymer was reprecipitated from tetrahydrofuran (THF)-water and further reprecipitated from THF-methanol. The purified precipitate was dried at room temperature under reduced pressure. The resulting photosetting resin having a cinnamoyl group as a photosensitive group had an acid value of 81 mgKOH/g, Tg of 51° C., number average molecular weight of about 20,000 and the amount of cinnamoyl groups was 3.69 mole/kg. A solution of 100 parts of the resin in a mixture of 50 parts of propylene glycol methyl ether and 50 parts of n-butanol was used.

SYNTHESIS EXAMPLE 4 OF THE PHOTOSETTING RESIN

A mixture composed of 38 parts of methyl methacrylate, 38 parts of butyl acrylate, 24 parts of acrylic acid and 2 parts of azobisisobutyronitrile was added dropwise in a nitrogen atmosphere over 3 hours into 90 parts of propylene glycol monomethyl ether (hydrophilic solvent; maintained at 110° C.

After finishing the addition, the reaction mixture was aged for an hour, and then a mixture composed of 1 part of azobisdimethylvaleronitrile and 10 parts of propylene glycol monomethyl ether was added dropwise over an hour and aged for further 5 hours to obtain a solution of high acid value acrylic resin having an acid value of 115 mgKOH/g.

To the solution thus obtained, 30 parts of allyl glycidyl ether, 0.12 part of hydroquinone and 0.6 part of tetraethylammonium bromide were added and reacted at 110° C. for 5 hours with air blowing to obtain a solution of photosetting resin having an acid value of about 54 mgKOH/g, degree of unsaturation of 1.15 mole/kg, Tg of 25° C. and number average molecular weight of about 18,000.

SYNTHESIS EXAMPLE 5 OF THE PHOTOSETTING RESIN

Polymerization was carried out at 110° C. by using 20 parts of methyl methacrylate, 60 parts of acrylic acid, 20 parts of methacrylic acid and 6 parts of t-butyl peroxide in 90 parts of n-butyl alcohol. To the reaction mixture, 114 parts of glycidyl methacrylate, 0.24 part of hydroquinone and 1.0 part of tetraethylammonium bromide were added and reacted by carrying out the same procedures as described in Synthesis example 1 to obtain a solution of photosetting resin having an acid value of about 70 mgKOH/g, degree of unsaturation of 3.75 mole/kg, Tg of 8° C. and number average molecular weight of about 18,000.

SYNTHESIS EXAMPLE 6 OF THE PHOTOSETTING RESIN

A mixture composed of 30 parts of glycidyl methacrylate 5 parts of styrene, 24 parts of n-butyl methacrylate, 23 parts of methyl acrylate, 18 parts of dimethylaminoethyl methacrylate and 5 parts of azobisisovaleronitrile was added dropwise in a nitrogen atmosphere over 3 hours into 90 parts of ethoxyethanol maintained at 80° C. After finishing the addition, the reaction mixture was aged for an hour and then a mixture composed of 1 g of azobisdimethylvaleronitrile and 10 parts of ethoxyethanol was added over an hour and further aged for 5 hours to obtain a solution of acrylic resin. To the resin solution, 15 parts of acrylic acid and 0.13 part of hydroquinone were added and reacted at 110° C. for 5 hours with air blowing to obtain a solution of photosetting resin having an amine value of 56, unsaturation equivalent of 1.83 mole/kg, Tg of 20° C., and number average molecular weight of about 15,000.

SYNTHESIS EXAMPLE 7 OF THE PHOTOSETTING RESIN

A mixture composed of 50 parts of methyl methacrylate, 40 parts of butyl acrylate, 10 parts of acrylic acid and 2 parts of azobisisobutyronitrile was added dropwise in a nitrogen atmosphere over 3 hours into 90 parts of propylene glycol monomethyl ether (hydrophilic solvent) maintained at 110° C. After finishing the addition, the reaction mixture is aged for an hour and then a mixture composed of 1 part of azobisdimethylvaleronitrile and 10 parts of propylene glycol monomethyl ether was added dropwise over an hour. The mixture was further aged for 5 hours to obtain a solution of acrylic rosin having an acid value of 75 mgKOH/g. To the resultant solution, 20 parts of glycidyl methacrylate, 0.1 part of hydroquinone and 0.5 part of tetraethylammonium bromide were added and reacted at 110° C. for 5 hours with air blowing to obtain a solution of photosetting resin having an acid value of about 3 mgKOH/g, degree of unsaturation of 1.37 mole/kg, Tg of 21° C. and number average molecular weight of about 20,000.

SYNTHESIS EXAMPLE OF SENSITIZER

To a mixture of 20 parts of 4 diethylaminosalicylaldehyde and 18 parts of 2-ethoxycarbonylmethylbenzothiazole, 1 part of piperidine was added and reacted in an ethanol solvent for 12 hours at the room temperature. The reaction mixture was filtered and the crystal obtained was washed well with ethanol and dried to obtain 32 parts of 3-(benzothiazo-2-yl)-7-diethylaminocoumarin.

According to the method described in Dyes and Pigments, vol 1, 315(1980), 10 parts of the compound thus Obtained were suspended in 50 parts of DMF and 9 parts of an aqueous 30% NaCN solution were added dropwise at the room temperature. The mixture was reacted for an hour at the same temperature and 5 parts of bromine were added at 0° to 10° C. and stirred for 2 hours. The reaction mixture was filtered, washed well with water and dried to obtain 3-(benzothiazo-2-yl)-4-cyano-7-diethylaminocoumarin.

Further, 9 parts of the cyanated coumarin obtained were reacted with 21.6 parts of 98% sulfuric acid in 100 parts of ethanol at 80° C. for 3 hours and allowed to cool. The reaction mixture was poured into 300 parts of water and neutralized.

Precipitated crystal was filtered, washed well with water and dried to obtain 7 parts of 3-(benzothiazo-2-yl)-4-ethoxycarbonyl-7-diethylaminocoumarin. The sensitizer thus obtained will hereinafter be refered to as LS-1.

Melting point; 155°–157° C.

Electron spectrum; maximum absorption ($\lambda$ max) 470 nm (in acetone)

Elemental analysis; $C_{23}H_{22}N_2O_4S$ CHN Calculated (%) 65.40, 5.21, 6.64, Found (%) 65.31, 5.33, 6.69.

NMR spectrum (δ/ppm); in DMSO-$H_6$ 1.19(t, 6H), 1.35(t, 3H), 3.52(q, 4H) 4.55(q, 2H), 6.65~8.15(m, 7H)

IR absorption spectrum (KBr tablet);

Shown in FIG. 1.

Other sensitizers were also prepared according to the above procedures. Structures, melting points and elemental analysis values of these sensitizers from LS-2 to LS-7 are illustrated in Table 1.

EXAMPLE 1

After dissolving 180 parts of the photosetting resin solution obtained in synthesis example 1, that is, 100 parts of the solid matter in 290 parts of ethyl acetate, a solution of 1 part of the sensitizer LS-1:

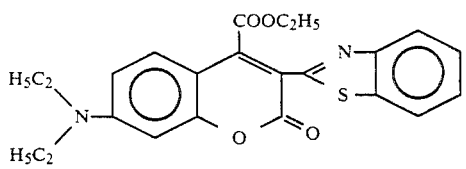

in 5 parts of benzyl alcohol was added to the above solution and then a solution of 7 parts of di-tert butyl diperoxyisophthalate (hereinafter refered to as PBIF) as a reaction initiator in 10 parts of benzyl alcohol was added and mixed to obtain a uniform mixture.

The mixture was applied to the surface of a copper clad laminated board with a spin coater and dried at 80° C. for 10 minutes to obtain a photosensitive film having a thickness of 12μm. The film had a smooth and tack free surface.

The photosensitive film was irradiated with argon laser beams having a wavelength of 488 nm, and successively subjected to development treatment at 30° C. for a minute with a 1% aqueous sodium carbonate solution and washed with water to form an image. By using a photographic step tablet film (a product of Eastman Kodak Co.), remained numbers of insolubilization steps were examined to obtain minimum energy of exposure required for curing the photo-setting film. The minimum exposure energy for curing was defined as the sensitivity and is illustrated in Table 1. Smaller value indicates better sensitivity.

EXAMPLES 2–12

The same procedures as described in Example 1 were carried out to prepare samples and to form images except that the photosetting resin, ethylenically unsaturated compound, sensitizer solution, polymerization initiator, benzotriazols and binder were used as illustrated in Table 1. Benzotriazoles were dissolved in ethyl acetate and used as a 10% solution.

Examples 1–4 and Examples 8–12 were treated for development of image at 30° C. for a minute by using a 1% aqueous sodium carbonate solution, Example 5 was treated at 30° C. for a minute by using 2% lactic acid solution, and Examples 6–7 were treated by using trichloroethylene.

Chemical names and structures of abbreviations in Table 2 and 3 are as follows:

Sensitizers

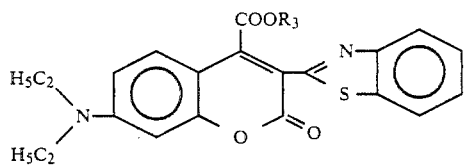

LS-1 $R_3$: $C_2H_5$

LS-2

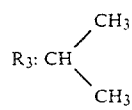

LS-3 $R_3$: $C_4H_9$

LS-4 $R_3$: $C_2H_4OC_2H_5$

LS-5 $R_3$: $C_2H_4OC_2H_4OH$

LS-6 $R_3$: H

LS-7 $R_3$: $CH_2COOC_2H_5$

Polymerization initiator

PBIF: di-tert-butyl peroxyisophthalate

MK: Michler's ketone

BP: benzophenone

BTTB: 3,3',4,4'-tetra(tert-butylperoxycarbonyl)benzophenone

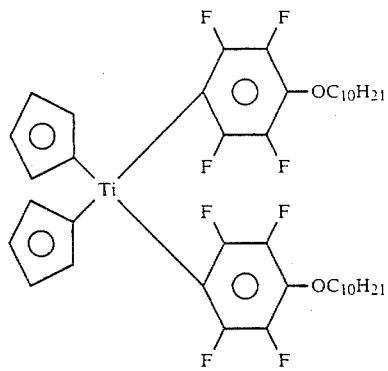

T-1

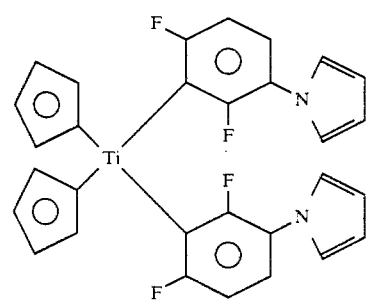

T-2

-continued

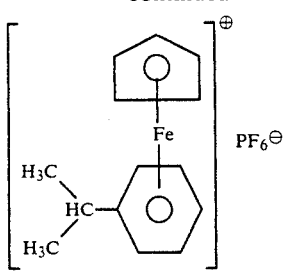
F-1

Benzotriazols and binder

N-1

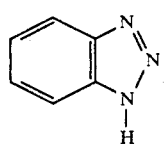

B-1: methyl methacrylate/2-ethylhexyl methacrylate/-methacrylic acid copolymer (weight ratio 70/20/10, acid value 65 mgKOH/g, molecular weight 10,000)
B-2: ethyl cellulose (molecular weight 50,000)

Ethylenically unsaturated compound

E-1: trimethylolpropane triacrylate
E-2: pentaerythritol triacrylate

Solvent

S-1: ethyl acetate
S-2: benzyl alcohol
S-3: butoxy ethanol
S-4: diethylene glycol dimethyl ether
S-5: ethanol Example 13

After completely neutralizing 180 parts (100 parts of solid portion) of the photosetting resin solution obtained in Synthesis example 1 by the addition of 6 parts of triethylamine, a solution of 1 part of the sensitizer LS-1 in 5 parts of benzylalcohol solvent was added and mixed, and a solution of 7 parts of polymerization initiator PBIF in 10 parts of benzyl alcohol was further added and mixed. Successively deionized water was added to the mixture thus obtained to adjust the solids content to 15% and the resulting mixture was used as an electrodeposition coating bath having a pH of 6.5.

Electrodeposition coating was carried out in the above coating bath for 3 minutes at a bath temperature of 25° C. with a direct current of 45 mA/cm$^2$ by using a copper clad laminated board for a printed circuit having dimensions of 40×150×0.8 mm as an anode. The electrodeposited film obtained was washed with water and dried at 80° C. for 5 minutes to obtain a smooth and tack-free photosensitive film having a thickness of 12 μm. The photosensitive film was irradiated with argon laser beams having a wavelength of 488 nm and then subjected to development treatment at 30° C. for a minute by using a 1% aqueous sodium carbonate solution, followed by washing with water to form an image. By using the photographic step tablet film (a product of Eastman Kodak Co.), the minimum exposure energy required for curing the photosetting film was defined as sensitivity and is illustrated in Table 3.

Examples 14–22

Electrodeposition coating baths were prepared and images were formed by carrying out the same procedures as described in Example 13 except that the photosetting resins, sensitizers, solvents, polymerization initiators and nitrogen containing compound were used as illustrated in Table 3. Sensitivity of the films obtained are illustrated in Table 3.

Example 23

After neutralizing 100 parts (as solid matter) of the photosensitive resin obtained in Synthesis example 6 with 3.6 parts of acetic acid, a solution of 1 part of sensitizer LS-5 in 5 parts of benzyl alcohol and a solution of 9 parts of 3,3'-4,4'-tetra (tertbutylperoxycarbonyl)benzophenone (BTTB) in 10 parts of benzyl alcohol were added and mixed. Deionized water was then added to the resulting mixture so as to make the solid content 15% and used as an electrodeposition coating bath having pH of 6.4.

Electrodeposition coating was carried out in the above obtained coating bath for 3 minutes at a bath temperature of 25° C. with a direct current of 45 mA/cm$^2$ by using a copper clad laminated board for printed circuit having dimensions of 40×150×0.8 mm as a cathode. The electrodeposited film obtained was washed with water and dried at 80° C. for 5 minutes to obtain a smooth and tack free photosensitive film having a thickness of 12 μm.

The photosensitive film was irradiated with argon laser beams having a wavelength of 488 nm and then subjected to development treatment at 30° C. for a minute by using a 2% aqueous lactic acid solution to form an image.

The photosensitive film was exposed to visible radiation by using the above mentioned spectral irradiation device and then subjected to development at 30° C. for a minute by using a 2% aqueous lactic acid solution, and followed by washing to form an image. The minimum exposure energy required for leaving a cured film at a wavelength of 488 nm was defined as sensitivity and is illustrated in Table 3.

Example 24

An electrodeposition bath was prepared and an image was formed by carrying out the same procedures as described in Example 23 except that polymerization initiator illustrated in Table 3 was used. Sensitivity obtained is illustrated in Table 3.

REFERENCE EXAMPLE

Resolution of image formed was examined on several compositions used in the examples. Resolution was evaluated with a pattern forming property by direct depiction. The equipment used was a high accuracy laser direct depicting apparatus LP 3000 D(Trade Mark of NIKON CORP.) In the test, the conductor portion exposed after development treatment was removed by an acid etchant or an alkali etchant. The resolution was evaluated with the finest line/space width which could be formed. Results are illustrated in Table 4.

Better resolution could be obtained by a smaller amount of laser exposure in the case of electrodeposition rather than the case of spin-coating the solution.

TABLE 1

[Chemical structure: benzothiazole coumarin derivative with OR, C=O, H5C2-N(C2H5)- groups]

| Example LS No. | R in above formula | mp (°C.) | λmax (nm) |
|---|---|---|---|
| 1 | C₂H₅ | 155~157 | 470 |
| 2 | CH(CH₃)₂ | 196~198 | 470 |
| 4 | C₂H₄OC₂H₅ | 162~163 | 471 |
| 5 | C₂H₄OC₂H₄OH | 145~146 | 472 |
| 6 | H | 260< | 478 |

TABLE 1-continued

[Chemical structure: same as above]

| Example LS No. | R in above formula | mp (°C.) | λmax (nm) |
|---|---|---|---|
| 7 | C₂H₄COOC₂H₅ | 165~167 | 470 |

TABLE 2

| Example | Photosetting resin (solid matter) or Ethylenically unsaturated compound Compound | Amount | Sensitizer Compound | Amount | Solvent Compound | Amount | Polymerization initiator Compound | Amount | Benzotriazols and Binders Compound | Amount | Sensitivity (mj/cm²) |
|---|---|---|---|---|---|---|---|---|---|---|---|
| 1 | Synthesis example 1 | 100 | LS-1 | 1 | S-1 / S-2 | 290 / 15 | PBIF | 7 | — | — | 2.1 |
| 2 | ↑ | 100 | ↑ | 1 | S-1 / S-2 / S-5 | 290 / 5 / 10 | MK / BP | 9 / 6 | — | — | 2.4 |
| 3 | ↑ | 100 | ↑ | 1 | S-1 / S-2 | 290 / 15 | BTTB | 9 | — | — | 1.0 |
| 4 | B-1 / E-1 | 50 / 50 | LS-2 | 3 | S-1 / S-2 | 100 / 15 | ↑ | ↑ | — | — | 1.7 |
| 5 | synthesis example 6 | 100 | LS-3 | 2 | ↑ | ↑ | PBIF | 7 | — | — | 3.5 |
| 6 | synthesis example 7 | 100 | LS-4 | 2 | ↑ | ↑ | ↑ | ↑ | — | — | 4.5 |
| 7 | E-2 | 60 | LS-5 | 1 | S-1 / S-2 | 80 / 15 | ↑ | ↑ | B-2 | 40 | 2.8 |
| 8 | synthesis example 1 | 100 | LS-1 | 1 | S-1 / S-2 | 290 / 15 | BTTB | 9 | N-1 | 2 | 0.6 |
| 9 | ↑ | ↑ | ↑ | ↑ | ↑ | ↑ | T-1 | 1 | ↑ | ↑ | 0.5 |
| 10 | ↑ | ↑ | ↑ | ↑ | ↑ | ↑ | F-1 | 3 | ↑ | ↑ | 0.7 |
| 11 | ↑ | ↑ | LS-6 | 2 | ↑ | ↑ | BTTB | 9 | — | — | 1.7 |
| 12 | ↑ | ↑ | LS-7 | 1 | ↑ | ↑ | PBIF | 7 | — | — | 3.1 |

TABLE 3

| Example | Photosetting resin (solid matter) Compound | Amount | Sensitizer Compound | Amount | Solvent Compound | Amount | Polymerization initiator Compound | Amount | Benzotriazols and Binders Compound | Amount | Sensitivity (mj/cm²) |
|---|---|---|---|---|---|---|---|---|---|---|---|
| 13 | Synthesis example 1 | 100 | LS-1 | 1 | S-2 / S-3 | 15 / 20 | PBIF | 7 | — | — | 2.9 |
| 14 | Synthesis example 2 | ↑ | LS-2 | 3 | S-2 / S-3 / S-5 | 15 / 20 / 10 | MK / BP | 9 / 6 | — | — | 3.6 |
| 15 | Synthesis example 3 | ↑ | LS-3 | 1 | S-2 / S-3 | 15 / 10 | PBIF | 7 | — | — | 3.4 |
| 16 | Synthesis example 4 | ↑ | LS-4 | 2 | S-2 / S-3 | 15 / 20 | PBIF | 7 | — | — | 3.1 |
| 17 | synthesis example 5 | ↑ | LS-5 | 1 | S-2 / S-3 | 15 / 40 | BTTB | 9 | — | — | 0.8 |
| 18 | ↑ | ↑ | ↑ | ↑ | S-2 / S-3 / S-4 | 5 / 20 / 5 | T-1 | 1 | — | — | 1.1 |
| 19 | ↑ | ↑ | ↑ | ↑ | ↑ | ↑ | T-2 | 1 | N-1 | 1 | 0.6 |
| 20 | synthesis example 1 | 100 | ↑ | ↑ | S-2 / S-3 | 15 / 20 | F-1 | 1 | — | — | 1.8 |
| 21 | ↑ | ↑ | LS-6 | 4 | S-2 / S-3 / S-4 | 5 / 20 / 5 | T-1 | 2 | — | — | 2.8 |
| 22 | ↑ | ↑ | LS-5 | ↑ | ↑ | ↑ | T-1 | 1 | N-1 | 0.5 | 1.8 |
| 23 | synthesis example 6 | 100 | ↑ | ↑ | S-2 / S-3 | 15 / 20 | BTTB | 9 | N-1 | 1 | 1.7 |
| 24 | ↑ | ↑ | ↑ | ↑ | ↑ | ↑ | F-1 | 3 | N-1 | 1 | 1.0 |

TABLE 4

| Example | Laser exposure (mj/cm²) | Resolution (μm/μm) Finest line/space width |
|---|---|---|
| 1 | 10 | 100 μm/100 μm |
| 4 | 10 | 90 μm/90 μm |
| 7 | 10 | 120 μm/120 μm |
| 9 | 10 | 70 μm/70 μm |
| 13 | 10 | 80 μm/80 μm |
| 14 | 10 | 120 μm/120 μm |
| 17 | 5 | 60 μm/60 μm |
| 19 | 5 | 50 μm/50 μm |
| 21 | 10 | 70 μm/70 μm |
| 22 | 10 | 60 μm/60 μm |
| 23 | 10 | 70 μm/70 μm |
| 24 | 10 | 60 μm/60 μm |

What is claimed is:

1. A visible radiation sensitive composition comprising:
(A) a photosetting resin containing a photosensitive group capable of crosslinking or polymerizing by photoirradiation,
(B) a sensitizer represented by the formula (i)

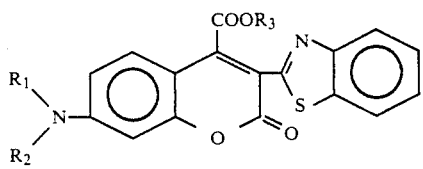

wherein $R_1$ and $R_2$ are the same or different lower alkyl group, and $R_3$ is a hydrogen atom, lower alkyl group, alkoxyalkyl group, hydroxyalkoxyalkyl group or alkoxycarbonylalkyl group, and
(C) a polymerization initiator.

2. The visible radiation sensitive composition of claim 1 wherein the photosensitive group contained in the photosetting resin (A) is a radical selected from the group consisting of (meth)acryloyl, cinnamoyl and allyl.

3. The visible radiation sensitive composition of claim 1 wherein the content of the photosensitive group in the photosetting resin (A) is in the range of from 0.2 to 5.0 mole/kg.

4. The visible radiation sensitive composition of claim 1 wherein the photosetting resin (A) has a glass transition temperature of at least 0° C. and a number average molecular weight of from 1,000 to 100,000.

5. The visible radiation sensitive composition of claim 1 wherein the photosetting resin (A) is an anionic resin obtained by the addition of a glycidyl containing unsaturated compound to a high acid value acrylic base resin.

6. The visible radiation sensitive composition of claim 1 wherein the photosetting resin (A) is an anionic resin obtained by the reaction of a hydroxyl containing high acid value acrylic base resin and cinnamoyl halide.

7. The visible radiation sensitive composition of claim 1 wherein the photosetting resin (A) is an anionic resin obtained by the addition of allyl glycidyl ether to a high acid value acrylic base resin.

8. The visible radiation sensitive composition of claim 1 wherein the photosetting resin (A) consists essentially of a combination of an ethylenically unsaturated compound containing a photosensitive group and a binder having an ionic group.

9. The visible radiation sensitive composition of claim 1 wherein the photosetting resin (A) is a cationic resin containing from 0.2 to 5 moles of a tertiary amino group or an onium base per kilogram of the resin.

10. The visible radiation sensitive composition of claim 1 wherein the sensitizer (B) is selected from the following chemical formulas.

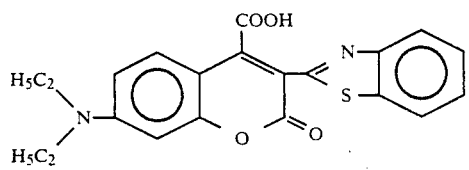

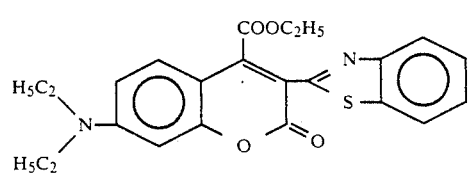

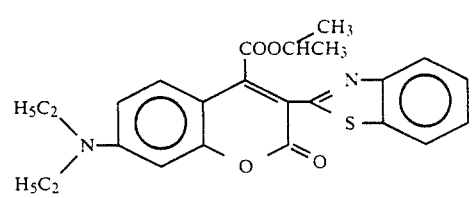

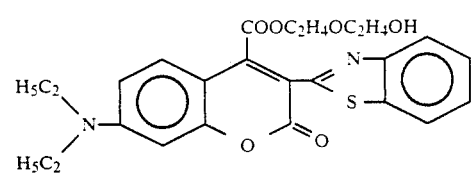

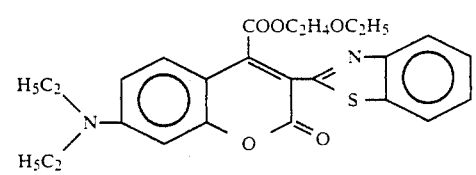

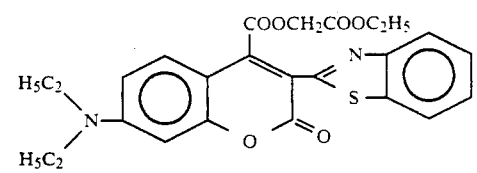

11. The visible radiation sensitive composition of claim 1 wherein the sensitizer (B) is mixed in the range of from 0.1 to 10 parts by weight per 100 parts by weight of the photosetting resin (A).

12. The visible radiation sensitive composition of claim 1 wherein the polymerization initiator (C) is an iron-arene complex or a titanocene compound.

13. The visible radiation sensitive composition of claim 12 wherein the iron-arene complex is represented by the formulas (I), (II) or (III):

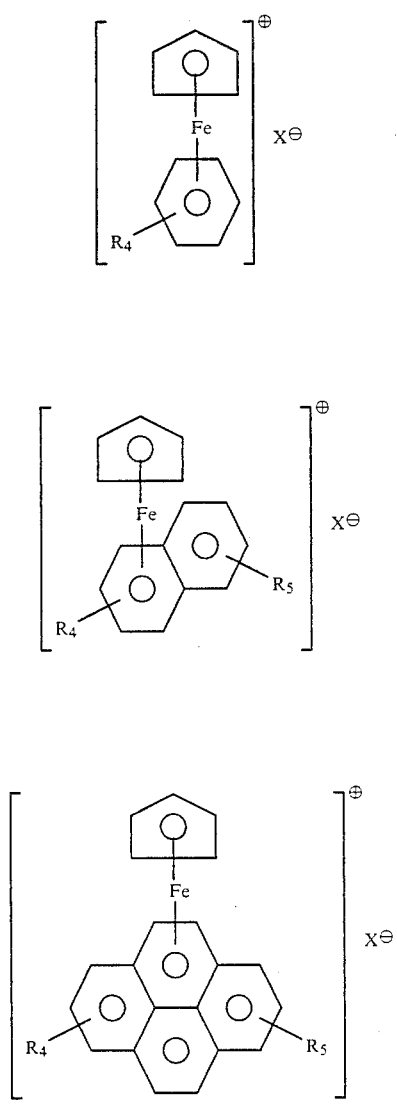

(I)

(II)

(III)

wherein X is $BF_4$, $PF_6$, $AsF_6$ or $SbF_6$, and $R_4$ and $R_5$ are straight or branched alkyl group having from 1 to 6 carbon atoms.

14. The visible radiation sensitive composition of claim 12 wherein the titanocene compound is selected from the following chemical formulas:

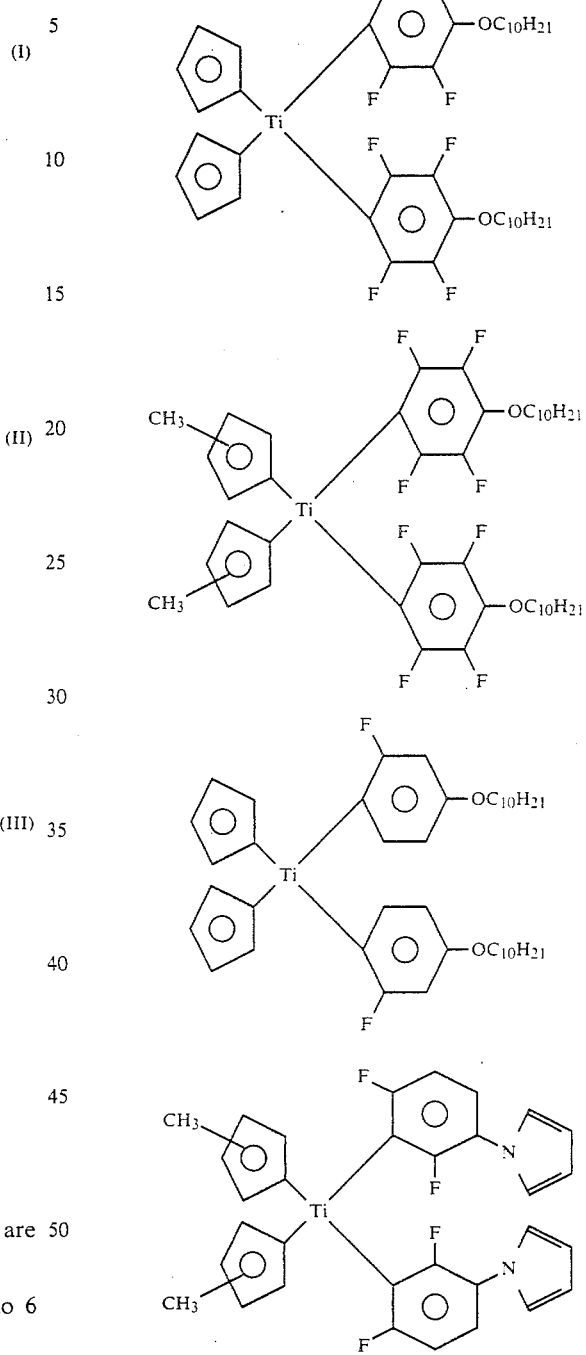

15. The visible radiation sensitive composition of claim 1 wherein the polymerization initiator (C) is mixed in the range of from 0.1 to 25 parts by weight per 100 parts by weight of the photosetting resin (A).

16. A visible radiation sensitive electrodeposition coating composition of claim 1 wherein the photosetting resin (A) is a water soluble substance or a water dispersible substance.

* * * * *

UNITED STATES PATENT AND TRADEMARK OFFICE
CERTIFICATE OF CORRECTION

PATENT NO. : 5,045,434

DATED : September 3, 1991

INVENTOR(S) : Yoshihara et al.

It is certified that error appears in the above-identified patent and that said Letters Patent is hereby corrected as shown below:

Column 32, third formula, lines 34 and 40, amend "$OC_{10}H_{21}$" to --$OC_{12}H_{25}$-- (both occurrences).

Signed and Sealed this

Thirteenth Day of April, 1993

Attest:

STEPHEN G. KUNIN

*Attesting Officer*            Acting Commissioner of Patents and Trademarks